US007692472B2

(12) United States Patent
Fujino (10) Patent No.: US 7,692,472 B2
(45) Date of Patent: Apr. 6, 2010

(54) HIGH-FREQUENCY SWITCHING CIRCUIT (75) Inventor: Hiroaki Fujino, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/843,827

(22) Filed: May 11, 2004

(65) Prior Publication Data
US 2005/0007179 A1    Jan. 13, 2005

(30) Foreign Application Priority Data
Jul. 7, 2003    (JP)    ............... 2003-193155

(51) Int. Cl.
*H03K 17/687*    (2006.01)
(52) U.S. Cl. ...................... 327/427; 327/434
(58) Field of Classification Search ................. 327/427, 327/430, 434, 437; 333/262
See application file for complete search history.

(56) References Cited

U.S. PATENT DOCUMENTS

| 4,837,530 | A | * | 6/1989 | Kondoh | .................. 333/81 A |
| 5,103,195 | A | | 4/1992 | Dunsmore | ............... 333/103 |
| 5,731,607 | A | | 3/1998 | Kohama | ................... 257/275 |
| 6,803,680 | B2 | * | 10/2004 | Brindle et al. | ........... 307/115 |
| 6,873,828 | B2 | * | 3/2005 | Asano et al. | ............... 455/78 |
| 2004/0051394 | A1 | | 3/2004 | Kitazawa et al. | ............ 307/112 |
| 2004/0077150 | A1 | | 4/2004 | Tosaka | ...................... 438/313 |

FOREIGN PATENT DOCUMENTS

JP    08-213893    8/1996

* cited by examiner

*Primary Examiner*—Quan Tra
(74) *Attorney, Agent, or Firm*—Keating & Bennett, LLP (57) ABSTRACT A high-frequency switching circuit includes, on a semiconductor substrate, FETs, electrode pads for applying a control voltage, gate wiring patterns for connecting gate terminals of the FETs to the electrode pads, and first resistors and second resistors connected in series with the gate wiring patterns. The first resistors are connected in series near the gate terminals of the FETs. The second resistors are connected in series near the electrode pads. The resistances of the first resistors and the second resistors are set to values large enough to inhibit the influence of an induced high frequency signal.

18 Claims, 5 Drawing Sheets

HIGH-FREQUENCY SWITCHING CIRCUIT

BACKGROUND OF THE INVENTION

1. Field of the Invention

The present invention relates to semiconductor switches built in an IC chip, and more particularly, to a semiconductor switch for use with high frequency signals.

2. Description of the Related Art

Various types of semiconductor switches are used as elements for switching on and off high frequency signals. Field effect transistors (hereinafter, simply referred to as "FETs") are widely used as such semiconductor switches.

When FETs are used as switching elements, normally, the state between a drain terminal and a source terminal is switched between a conducting state and a non-conducting state by using the drain terminal and the source terminal as switch terminals and by applying control signals to a gate terminal. In other words, applying a control voltage to the gate terminal that exceeds a threshold voltage Vth, which is required for generating a channel between the drain terminal and the source terminal, allows conduction between the drain terminal and the source terminal, and thus turns on (that is, short-circuits) the switch. Also, reducing the control voltage to lower than the threshold voltage Vth to the gate terminal disconnects (that is, isolates) the drain terminal from the source terminal, and thus turns off (that is, opens) the switch.

When such an FET is provided in an IC, the control voltage must be externally applied to the gate terminal. Thus, an electrode pad is arranged on the surface of the IC chip and a wiring pattern for connecting the electrode pad to the gate terminal of the FET is arranged in the IC.

When FETs are used as switching elements, high frequency signals are always applied to the drain terminal and the source terminal, irrespective of whether the FETs are turned on or turned off. Accordingly, because of the characteristics of high frequency signals, high frequency signals are induced in the gate terminal, to which the high frequency signals are not directly applied. This phenomenon increases in accordance with an increase in the level of high frequency signals.

The high frequency signals induced in the gate terminal are transferred, via the wiring pattern and the electrode pad, to a voltage source (signal source) that supplies the control voltage to the gate terminal. The high frequency signals transferred to the voltage source have adverse influences upon other elements and circuits driven by the voltage supplied from the voltage source.

Figure 4A:
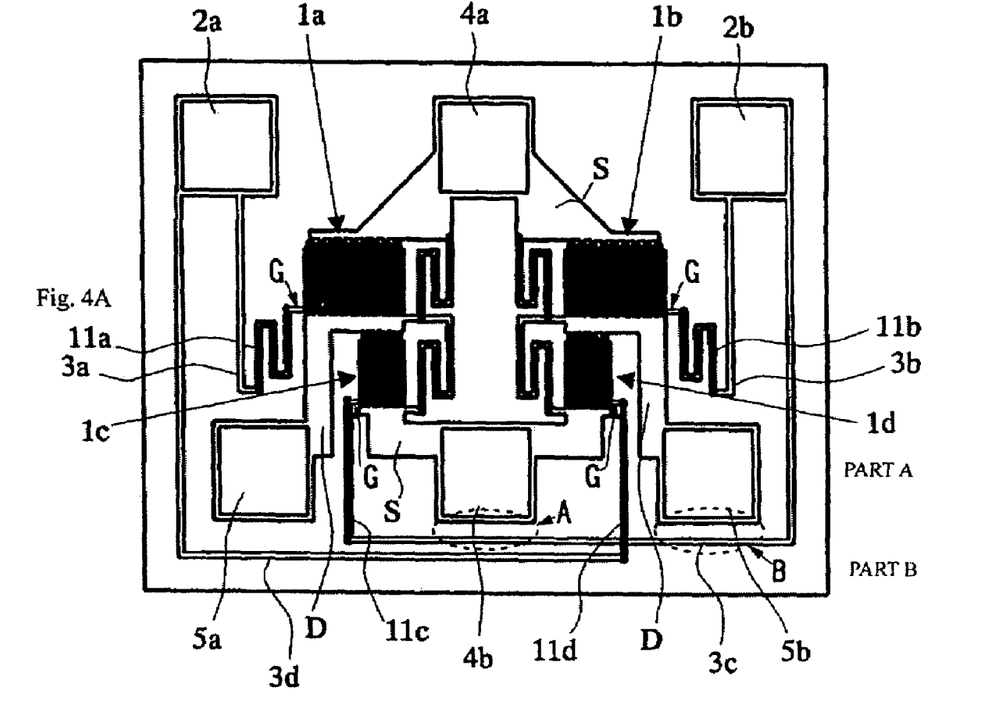
FIG. 4A is a schematic diagram showing the structure of a known high-frequency switching circuit.
Figure 4B:
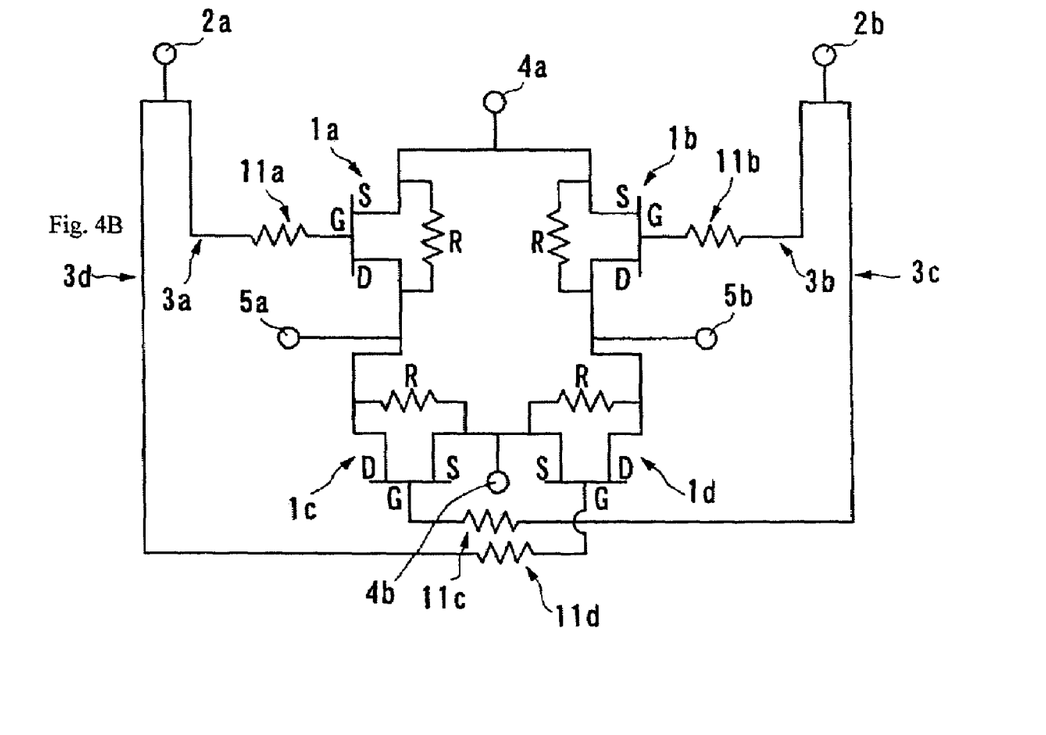
FIG. 4B is an equivalent circuit diagram showing the known high-frequency switching circuit.

A high-frequency switching circuit shown in FIGS. 4A and 4B is suggested as a known high-frequency switching circuit using an FET that solves the problems described above.

FIG. 4A is a schematic diagram showing the structure of a known single-pole dual-throw (SPDT) high-frequency switching circuit. FIG. 4B is an equivalent circuit diagram of the known SPDT high-frequency switching circuit.

Referring to FIGS. 4A and 4B, reference numerals 1a to 1d denote FETs, reference numerals 2a and 2b denote electrode pads for applying a control voltage, reference numerals 3a to 3d denote gate wiring patterns, reference numerals 4a and 4b denote source input/output electrodes, reference numerals 5a and 5b denote drain input/output electrodes, and reference numerals 11a to 11d denote resistors. Also, reference symbol G represents a gate terminal of each of the FETs, reference symbol D represents a drain terminal of each of the FETs, and reference symbol S represents a source terminal of each of the FETs. For example, in a case where the source input/output electrode 4b is grounded and where the source input/output electrode 4a and the drain input/output electrode 5a or the drain input/output electrode 5b function as input and output terminals, such a circuit operates as an SPDT switch. Also, in such a circuit, the resistors 11a to 11d are provided on portions of the wiring patterns near the gate terminals G of the FETs 1a to 1d, respectively.

With this arrangement, an unnecessary high frequency signal induced in one or more of the gate terminals G is attenuated by the resistors 11a to 11d, and the high frequency signal is thus inhibited from being transferred to the voltage source via the electrode pads 2a and 2b. (For example, refer to Japanese Patent No. 3284015.)

However, an increase in the number of FETs provided in an IC due to an increase in the density of the IC may necessitate a long distance between a gate terminal and an electrode pad in terms of design. In other words, the length of a wiring pattern (hereinafter, referred to as a "gate wiring pattern") between the gate terminal and the electrode pad increases. The increase in the length of the gate wiring pattern causes the gate wiring pattern to be more susceptible to high frequency signals from the outside. In other words, a high frequency signal in another circuit that should not be transferred is inevitably induced in the gate wiring pattern. In particular, when circuit elements in an IC are close to each other due to an increase in the density, the gate wiring pattern of an FET may be arranged near the source terminal and the drain terminal of another FET (shown by Part A and Part B in FIG. 4A) and near a wiring pattern connected in the source terminal or the drain terminal. In such a case, high frequency signals are likely to be induced to the gate wiring pattern, as described above.

In such a case, even if a resistor is provided in a portion of the gate wiring pattern near the gate terminal, as in the known high-frequency switching circuit described above, a high frequency signal is induced and transferred to the gate wiring pattern between the resistor and the electrode pad. Thus, the adverse influence upon a voltage source connected to the electrode pad and upon an element and a circuit driven by the voltage supplied from the voltage source cannot be avoided. Also, in contrast, if a resistor were connected in series with only a portion of the gate wiring pattern near the electrode pad, a high frequency signal induced in the gate wiring pattern would be applied to the gate terminal without being attenuated. Thus, stable operation of the FETs could not be achieved.

Figure 5:
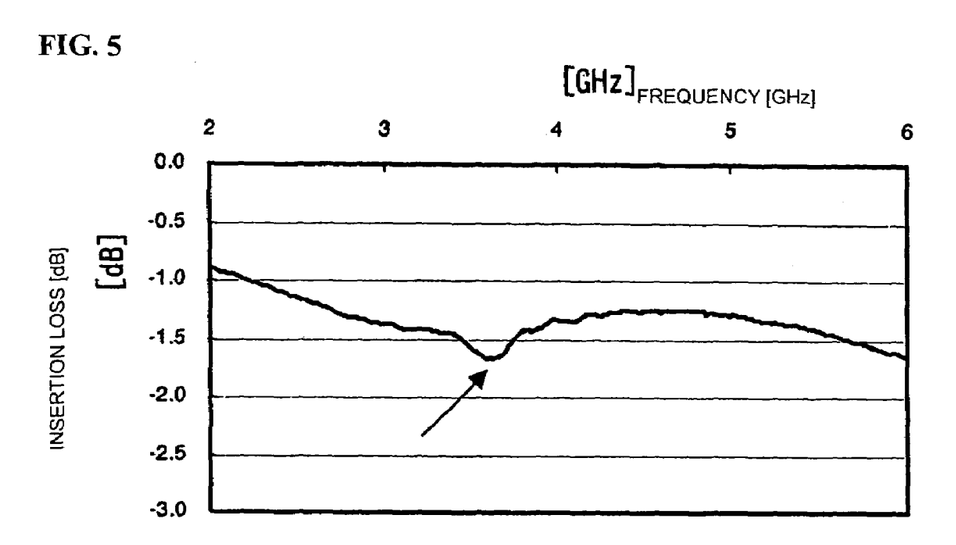
FIG. 5 is a graph showing the frequency characteristics of insertion loss of the high-frequency switching circuit shown in FIGS. 4A and 4B.

Furthermore, due to the induction of the high frequency signal in the gate wiring pattern, the high frequency signal is superimposed on control voltage signals applied to the gate terminals of the FETs. Thus, a resistor connected in series near the gate terminal cannot inhibit the change of the control voltage signal due to the high frequency signal. This adversely affects the frequency characteristics of insertion loss and isolation of the FETs. FIG. 5 is a frequency characteristic diagram showing the insertion loss in the high-frequency switching circuit shown in FIG. 4. As shown in FIG. 5, in the known high-frequency switching circuit, a ripple (see the arrow in FIG. 5) appears in a particular frequency range. In other words, the insertion loss and the isolation at a particular frequency are deteriorated. Since this frequency depends in part on the design of the mounting board of the IC, the frequency at which the ripple appears may be equal to the frequency used for the switching circuit, depending on the design details of the mounting board.

SUMMARY OF THE INVENTION

Accordingly, it is an object of the present invention provides a high-frequency switching circuit using an FET which is capable of inhibiting the adverse influence of a high frequency signal induced in a gate wiring pattern.

A high-frequency switching circuit according to the present invention includes a semiconductor substrate; at least one field effect transistor provided on the semiconductor substrate; an electrode pad provided on the semiconductor substrate for applying a control voltage to a gate terminal of the field effect transistor; a gate wiring pattern provided on the semiconductor substrate for connecting the electrode pad to the gate terminal; a first resistor connected in series with a portion of the gate wiring pattern near the gate terminal of the field effect transistor; and a second resistor connected in series with a portion of the gate wiring pattern near the electrode pad.

With this arrangement, the first and second resistors are connected in series with portions of the gate wiring pattern near the gate terminal of the field effect transistor (FET) and near the electrode pad, respectively, the gate wiring pattern connecting the gate terminal of the FET to the electrode pad. Accordingly, a high frequency signal induced in the gate wiring pattern is attenuated by the resistor connected in series near the gate terminal and by the resistor connected in series near the electrode pad, and is thus not transferred to either the FET or the electrode pad. Thus, the influence of the high frequency signal upon the FET, a voltage source connected to the electrode pad, and an element and a circuit driven by the voltage supplied from the voltage source can be inhibited. Therefore, a high-frequency switching circuit with stable characteristics can be realized.

A second high-frequency switching circuit according to the present invention includes a semiconductor substrate; a plurality of field effect transistors provided on the semiconductor substrate; an electrode pad provided on the semiconductor substrate for applying a control voltage one or more to gate terminals of the field effect transistors; a gate wiring pattern provided on the semiconductor substrate, the gate wiring pattern extending from the electrode pad and branching off into a plurality of branches to be connected to the gate terminals; a plurality of first resistors respectively connected in series with corresponding portions of the gate wiring pattern near the gate terminals of the field effect transistors; and a second resistor connected in series with a portion of the gate wiring pattern between plurality of the first resistors and the electrode pad, and near the electrode pad.

With this arrangement, in a circuit in which a plurality of field effect transistors (FETs) are connected for example in parallel with each other by the gate wiring pattern with respect to one electrode pad, the first and second resistors are connected in series with portions of the gate wiring pattern near the gate terminals of the FETs and near the electrode pad, respectively, the gate wiring pattern connecting the gate terminals of the FETs to the electrode pad. Accordingly, a high frequency signal induced in the gate wiring pattern is attenuated by the resistors without being transferred to the FETs and the electrode pad. Thus, the influence of the high frequency signal upon the FETs, a voltage source connected to the electrode pad, and a circuit element driven by the voltage supplied from the voltage source can be inhibited. Therefore, a high-frequency switching circuit with stable characteristics can be realized.

In the high-frequency switching circuits according to the present invention, the connection position of the second resistor may advantageously be separated from the electrode pad by 200 μm or less.

With this arrangement, since the resistor connected in series near the electrode pad is separated from the electrode pad by 200 μm or less, the distance between the resistor and the electrode pad is very small. Thus, inhibition of the transfer of the high frequency signal to the electrode pad is further improved.

Other features and advantages of the present invention will become apparent from the following description of embodiments of the invention which refers to the accompanying drawings.

DESCRIPTION OF EMBODIMENTS OF THE INVENTION

A high-frequency switching circuit 1 according to a first embodiment of the present invention will be described with reference to FIGS. 1A and 1B and FIG. 2.

Figure 1A:
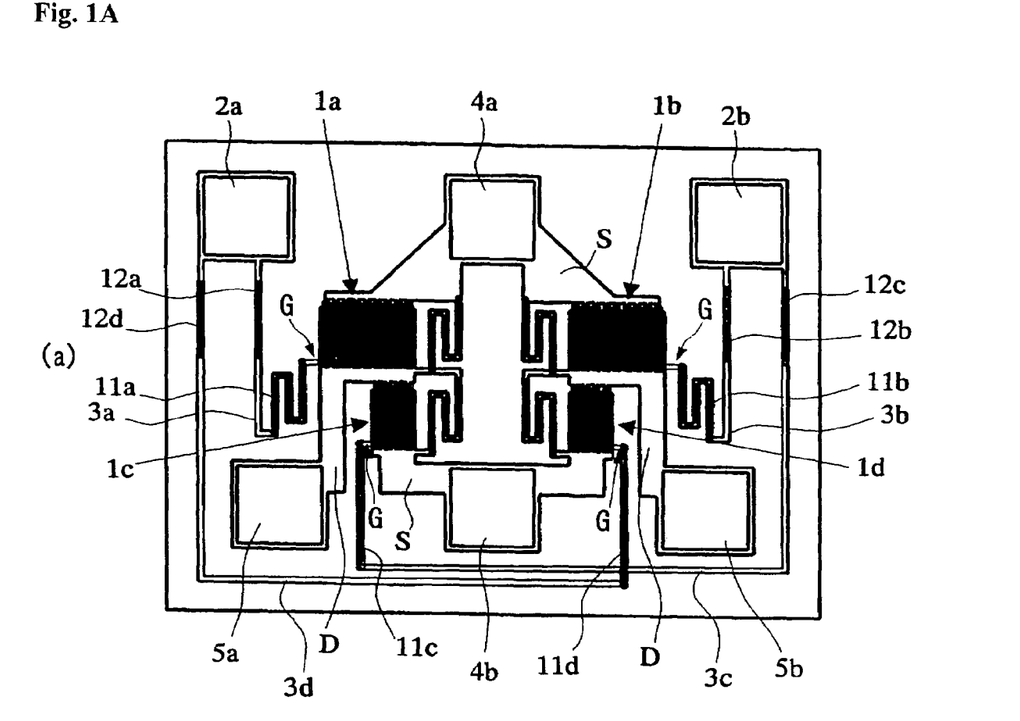
FIG. 1A is a schematic diagram showing the structure of a high-frequency switching circuit according to a first embodiment.

FIG. 1A is a schematic diagram showing the structure of the single-pole dual-throw (SPDT) high-frequency switching circuit 1 according to the first embodiment. FIG. 1B is an equivalent circuit diagram of the SPDT high-frequency switching circuit according to the first embodiment.

Figure 1B:
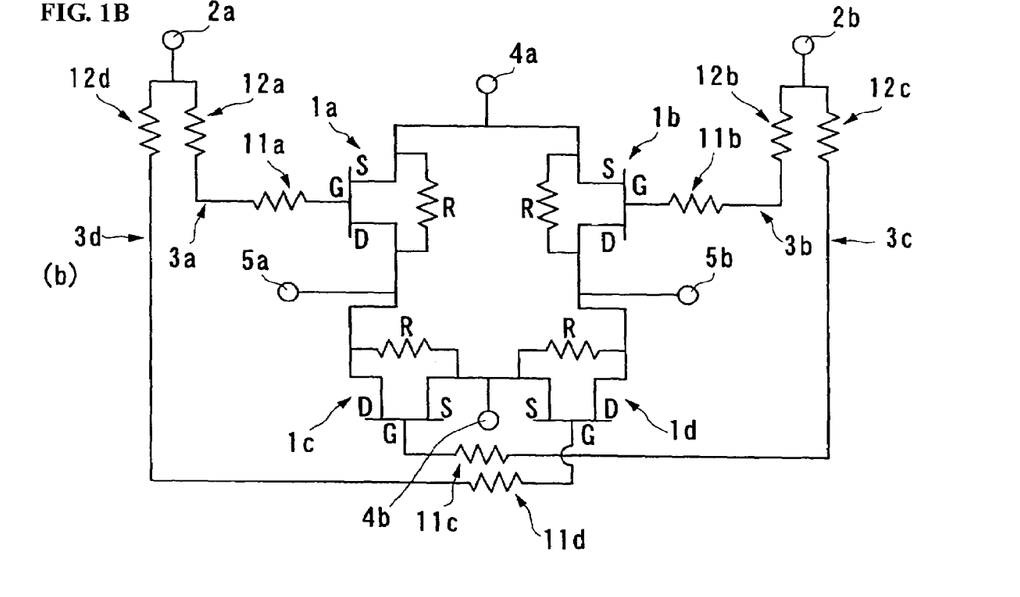
FIG. 1B is an equivalent circuit diagram showing the high-frequency switching circuit according to the first embodiment.

Referring to FIG. 1, the high-frequency switching circuit 1 includes, on a semiconductor substrate, FETs 1a to 1d, electrode pads 2a and 2b for applying control voltage signals, and gate wiring patterns 3a to 3d. The gate wiring pattern 3a connects the gate terminal G of the FET 1a to the electrode pad 2a. The gate wiring pattern 3b connects the gate terminal G of the FET 1b to the electrode pad 2b. The gate wiring pattern 3c connects the gate terminal G of the FET 1c to the electrode pad 2b. The gate wiring pattern 3d connects the gate terminal G of the FET 1d to the electrode pad 2a. Resistors 11a and 12a, resistors 11b and 12b, resistors 11c and 12c, and resistors 11d and 12d are connected on the gate wiring patterns 3a, 3b, 3c and, 3d, respectively. The high-frequency switching circuit 1 further includes a source input/output electrode 4a connected to source terminals S of the FETs 1a and 1b, a source input/output electrode 4b connected to source terminals S of the FETs 1c and 1d, a drain input/output electrode 5a connected to drain terminals D of the FETs 1a and 1c, and a drain input/output electrode 5b connected to drain terminals D of the FETs 1b and 1d.

A gate terminal G of the FET 1a is connected to the electrode pad 2a via the gate wiring pattern 3a, and the resistor 11a is connected in series with a portion of the gate wiring pattern 3a near the gate terminal G. Also, the resistor 12a is connected in series with a portion of the gate wiring pattern 3a near the electrode pad 2a. Advantageously, the resistor 12a is arranged, for example, such that the distance between the end of the resistor 12a near the electrode pad 2a and the connection end of the electrode pad 2a is 200 µm or less.

Also, a gate terminal G of the FET 1b is connected to the electrode pad 2b via the gate wiring pattern 3b, and the resistor 11b is connected in series with a portion of the gate wiring pattern 3b near the gate terminal G. Also, the resistor 12b is connected in series with a portion of the gate wiring pattern 3b near the electrode pad 2b.

Also, a gate terminal G of the FET 1c is connected to the electrode pad 2b via the gate wiring pattern 3c, and the resistor 11c is connected in series with a portion of the gate wiring pattern 3c near the gate terminal G. Also, the resistor 12c is connected in series with a portion of the gate wiring pattern 3c near the electrode pad 2b.

Also, a gate terminal G of the FET 1d is connected to the electrode pad 2a via the gate wiring pattern 3d, and the resistor 11d is connected in series with a portion of the gate wiring pattern 3d near the gate terminal G. Also, the resistor 12d is connected in series with a portion of the gate wiring pattern 3d near the electrode pad 2c.

The electrode pads 2a and 2b are connected to a voltage supply source, which is not shown. A control voltage signal generated in the voltage supply source is supplied to the gate terminals G of the FETs 1a to 1d via the electrode pads 2a and 2b and the gate wiring patterns 3a to 3d.

A control voltage signal of a voltage more than or equal to a predetermined threshold voltage Vth applied to the gate terminals G of the FETs 1a to 1d allows conduction between the source terminals S and the drain terminals D. Thus, the signal is transferred between the source terminals S and the drain terminals D. In other words, a high frequency signal is transferred between the source input/output electrodes 4a and 4b and the drain input/output electrodes 5a and 5b. In contrast, if the voltage of the control voltage signal applied to the gate terminals G is lower than the threshold voltage Vth, the source terminals S are disconnected (that is, isolated) from the drain terminals D, and the signal is thus not transferred between the drain terminals D and the source terminals S. In other words, the high frequency signal is not transferred between the source input/output electrodes 4a and 4b and the drain input/output electrodes 5a and 5b.

As described above, depending on the voltage of the control voltage signal applied to the gate terminals G of the FETs 1a to 1d, the FETs 1a to 1d function as switching elements.

The resistance of the resistors 11a to 11d and the resistors 12a to 12d is set to a value large enough to satisfactorily attenuate a high frequency signal induced from other circuits to the gate wiring patterns 3a to 3d. The resistance of the resistors 11a to 11d and the resistors 12a to 12d may be set to a predetermined value by adjusting the line width of the gate wiring patterns 3a to 3d or by using different materials for the wiring patterns. Furthermore, a lumped constant resistance element may be provided in series.

By setting the resistance as described above, a high frequency signal induced in the gate wiring patterns 3a to 3d is inhibited from being transferred to the voltage supply source via the electrode pads 2a and 2b. Thus, the influence of a high frequency signal upon other circuit elements using a control voltage signal supplied from the voltage supply source as a driving source can be inhibited.

Also, even if the high frequency signal is superimposed on the control voltage signal applied to the gate terminals G, the resistors 11a to 11d and the resistors 12a to 12d inhibit the change of amplitude of the control voltage signal due to the high frequency signal. Thus, the control voltage applied to the gate terminals G is stabilized, and the switching operation of the FETs 1a to 1d can thus be stabilized.

Figure 2:
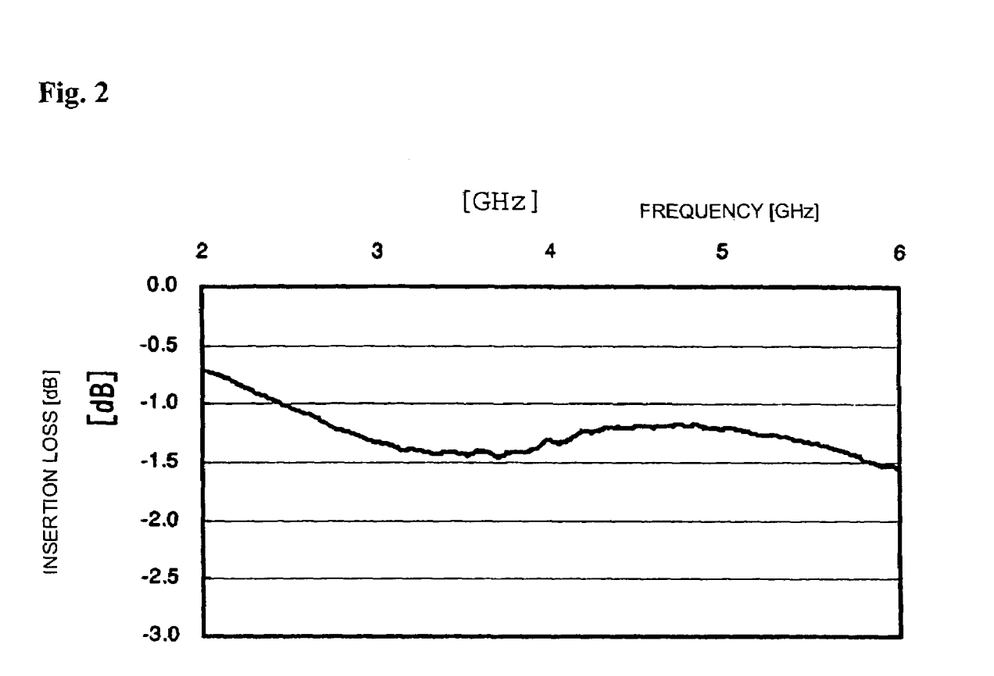
FIG. 2 is a graph showing the frequency characteristics of insertion loss of the high-frequency switching circuit shown in FIGS. 1A and 1B.

FIG. 2 is a graph showing the insertion loss characteristics of the high-frequency switching circuit 1 according to the first embodiment. Since the influence of superimposition of a high frequency signal on a control voltage signal is inhibited, the frequency characteristics of insertion loss of the switching circuit including FETs are stabilized, as shown in FIG. 2. Thus, appearance of the ripple, as in the known circuit shown in FIG. 5, is inhibited.

Accordingly, a high-frequency switching circuit with stable insertion loss characteristics can be realized. Although the insertion loss characteristics are shown in FIG. 2, the isolation characteristics can also be stabilized.

The high-frequency switching circuit 1 according to a second embodiment of the present invention will now be described with reference to FIGS. 3A and 3B.

Figure 3A:
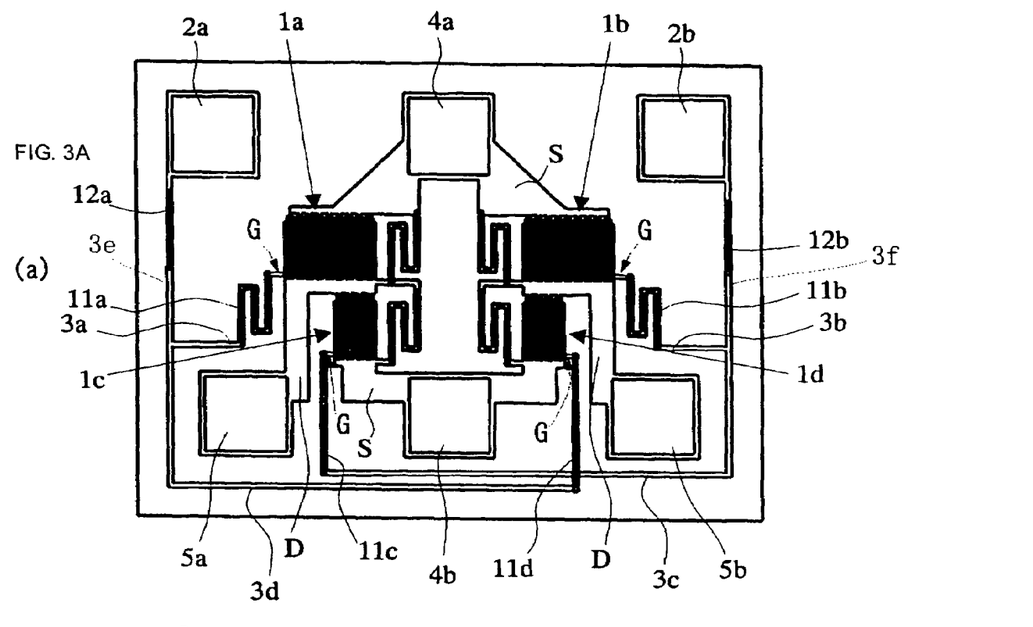
FIG. 3A is a schematic diagram showing the structure of a high-frequency switching circuit according to a second embodiment.

FIG. 3A is a schematic diagram showing the structure of the high-frequency switching circuit 1 according to the second embodiment. FIG. 3B is an equivalent circuit diagram of the high-frequency switching circuit 1 according to the second embodiment.

Figure 3B:
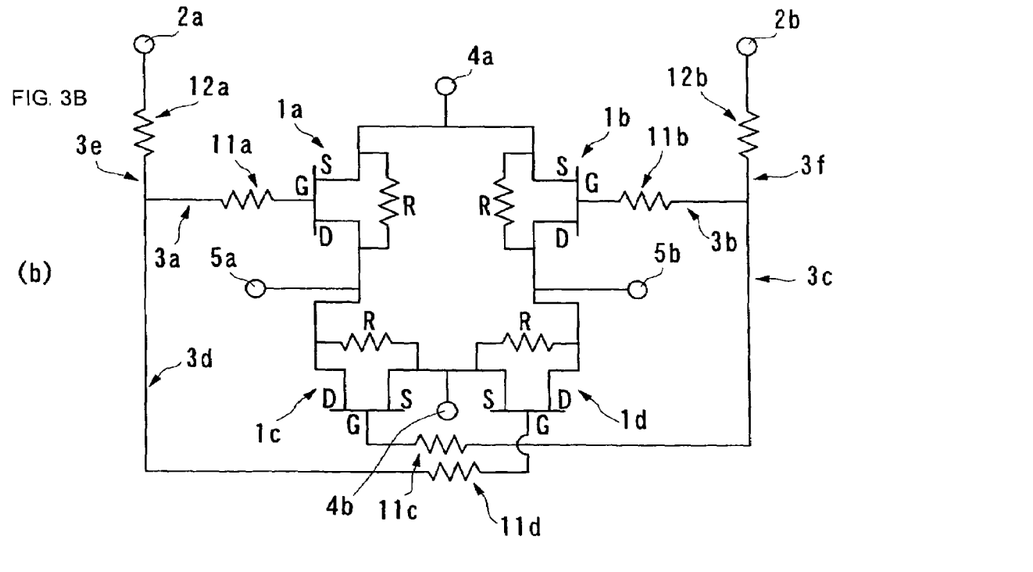
FIG. 3B is an equivalent circuit diagram showing the high-frequency switching circuit according to the second embodiment.

Referring to FIG. 3, the high-frequency switching circuit 1 includes, on the semiconductor substrate, the FETs 1a to 1d, the electrode pads 2a and 2b for applying a control voltage signal, and the gate wiring patterns 3a to 3f. The gate wiring patterns 3a and 3e connect the gate terminal G of the FET 1a to the electrode pad 2a. The gate wiring patterns 3b and 3f connect the gate terminal G of the FET 1b to the electrode pad 2b. The gate wiring patterns 3c and 3f connect the gate terminal G of the FET 1c to the electrode pad 2b. The gate wiring patterns 3d and 3e connect the gate terminal G of the FET 1d to the electrode pad 2a. The resistors 11a to 11d are connected on the gate wiring patterns 3a to 3d, respectively. Also, the resistor 12a is connected on the gate wiring pattern 3e between the electrode pad 2a and the node of the gate wiring patterns 3a and 3d, and the resistor 12b is connected on the gate wiring pattern 3f between the electrode pad 2b and the node of the gate wiring patterns 3b and 3c. The high-frequency switching circuit 1 further includes the source input/output electrode 4a connected to the source terminals S of the FETs 1a and 1b, the source input/output electrode 4b connected to the source terminals S of the FETs 1c and 1d, the drain input/output electrode 5a connected to the drain terminals D of the FETs 1a and 1c, and the drain input/output electrode 5b connected to the drain terminals D of the FETs 1b and 1d.

The gate terminal G of the FET 1a is connected to the electrode pad 2a via the gate wiring patterns 3a and 3e, and the gate terminal G of the FET 1d is connected to the electrode pad 2a via the gate wiring patterns 3d and 3e. The resistor 11a is connected on a portion of the gate wiring pattern 3a near the gate terminal G of the FET 1a, and the resistor 11d is connected on a portion of the gate wiring pattern 3d near the gate terminal G of the FET 1d. Also, the resistor 12a is connected in series on a portion of the gate wiring pattern 3e near the electrode pad 2a, the gate wiring pattern 3e being arranged between the electrode pad 2a and the node of the gate wiring patterns 3a and 3d.

Also, the gate terminal G of the FET 1b is connected to the electrode pad 2b via the gate wiring patterns 3b and 3f, and the gate terminal G of the FET 1c is connected to the electrode pad 2b via the gate wiring patterns 3c and 3f. The resistor 11b is connected on a portion of the gate wiring pattern 3b near the gate terminal G of the FET 1b, and the resistor 11c is connected on a portion of the gate wiring pattern 3c near the gate terminal G of the FET 1c. Also, the resistor 12b is connected in series on a portion of the gate wiring pattern 3f near the electrode pad 2b, the gate wiring pattern 3f being arranged between the electrode pad 2b and the node of the gate wiring patterns 3b and 3c.

The electrode pads 2a and 2b are connected to a voltage supply source, which is not shown. A control voltage signal generated in the voltage supply source is supplied to the gate terminals G of the FETs 1a to 1d at the same time via the electrode pads 2a and 2b and the gate wiring patterns 3a to 3f.

The FETs 1a to 1d according to the second embodiment operate in the same manner as the FETs 1a to 1d according to the first embodiment, and the FETs 1a to 1d function as switching elements in response to a control voltage signal supplied from the voltage supply source via the electrode pads 2a and 2b.

The resistance of the resistors 11a to 11d and the resistors 12a and 12b is set to a value large enough to satisfactorily attenuate a high frequency signal induced from other circuits to the gate wiring patterns 3a to 3f. Thus, the resistors 12a and 12b inhibit the high frequency signal induced to the gate wiring patterns 3a to 3f from being transferred to the electrode pads 2a and 2b. Also, the resistors 11a to 11d inhibit the high frequency signal induced to the gate wiring patterns 3a to 3f from being applied to the gate terminals G of the FETs 1a to 1d. Also, even if the high frequency signal is superimposed on the control voltage signal, the resistors 11a to 11d and the resistors 12a and 12b inhibit the change of the amplitude due to the superimposition. Thus, the FETs 1a to 1d stably operate as switching elements.

Also, the gate wiring patterns 3a and 3d are connected to each other and to the gate wiring pattern 3e, and the gate wiring patterns 3b and 3c are connected to each other and to the gate wiring pattern 3f. Thus, each of the resistors 12a and 12b is shared with two FETs. Accordingly, there is no need to provide a resistor near an electrode pad for each FET. Thus, the number of component parts constituting the switching circuit can be reduced. Consequently, the size of an IC chip accommodating this switching circuit can be reduced, and the cost can thus be reduced.

Although, in the second embodiment, a resistor is connected in series with a predetermined portion of a gate wiring pattern between an electrode pad and the node of two other gate wiring patterns, the wiring pattern between the electrode pad and the node is not necessarily required and may be replaced entirely by the resistor. More generally, in any embodiment, a portion of any wiring pattern may be replaced by a resistor if appropriate for design purposes.

Also, although the high-frequency switching circuit uses four FETs in each of the embodiments described above, the arrangement described above is applicable to any high-frequency switching circuit using one or more FETs.

Also, although the switching circuit provides an SPDT switch in each of the embodiments described above, the arrangement described above is also applicable to a switching circuit of another type using a semiconductor, such as a dual-pole dual-throw (DPDT) switch.

Although the present invention has been described in relation to particular embodiments thereof, many other variations and modifications and other uses will become apparent to those skilled in the art. Therefore, the present invention is not limited by the specific disclosure herein.

What is claimed is:

1. A high-frequency switching circuit comprising:
a semiconductor substrate;
at least one semiconductor switching device provided on the semiconductor substrate and including a gate terminal;
a gate electrode pad arranged on the semiconductor substrate to receive a control voltage to be applied to the gate terminal of the at least one semiconductor switching device;
a gate wiring pattern provided on the semiconductor substrate and arranged to connect the gate electrode pad and the gate terminal;
a first resistor connected in series with a first portion of the gate wiring pattern adjacent to the gate terminal of the at least one semiconductor switching device with no other circuit elements disposed on the gage wiring pattern between the first resistor and the gate terminal; and
a second resistor connected in series with a second portion of the gate wiring pattern, said second resistor including a first end being disposed closer to the gate electrode pad than a second end of the second resistor, the first end of the second resistor being connected with a first end of the gate electrode pad by the second portion of the gate wiring pattern with no other circuit elements disposed on the gate wiring pattern between the second resistor and the gate electrode pad; wherein
a third portion of the gate wiring pattern is arranged to receive spurious signals from and to be adjacent to a source electrode and a drain electrode of the at least one semiconductor switching device;
the first resistor and the second resistor and the corresponding first and second portions of said gate wiring pattern are disposed respectively on opposite sides of the source electrode and the drain electrode of the at least one semiconductor switching device; and
a distance between the first end of the second resistor and the first end of the gate electrode pad is about 200 μm or less.

2. A high-frequency switching circuit comprising:
a semiconductor substrate;
a plurality of field effect transistors provided on the semiconductor substrate and each including a gate terminal;
a gate electrode pad arranged on the semiconductor substrate, to receive a control voltage to be applied to the gate terminal of at least one of the plurality of field effect transistors;
a gate wiring pattern provided on the semiconductor substrate and arranged to connect the gate electrode pad to said gate terminals;
a plurality of first resistors each connected in series with a respective first portion of the gate wiring pattern adjacent to a respective one of the gate terminals of the plurality of field effect transistors with no other circuit elements disposed on the gate wiring pattern between a respective one of the first resistors and the respective one of the gate terminals; and
a second resistor connected in series with a second portion of the gate wiring pattern, said second resistor including a first end being disposed closer to the gate electrode pad than a second end of the second resistor, the first end of the second resistor being connected with a first end of the gate electrode pad by the second portion of the gate wiring pattern with no other circuit elements disposed on the gate wiring pattern between the second resistor and the gate electrode pad; wherein a third portion of the gate wiring pattern is arranged to receive spurious signals from and to be adjacent to a source electrode and a drain electrode of one of the field effect transistors;

the first resistors and the second resistor and the corresponding first and second portions of said gate wiring pattern are disposed respectively on opposite sides of the source electrode and the drain electrode of said one of the field effect transistors; and a distance between the first end of the second resistor and the first end of the gate electrode pad is about 200 μm or less.

3. The high-frequency switching circuit of claim 1, wherein said semiconductor switching device is a field-effect transistor.

4. The high-frequency switching circuit of claim 1, wherein said first and second resistors are interconnected by said third portion of said gate wiring pattern which runs adjacent to, and receives spurious signals from, said source electrode and said drain electrode.

5. The high-frequency switching circuit of claim 2, wherein said first and second resistors are interconnected by said third portion of said gate wiring pattern which runs adjacent to, and receives spurious signals from, said source electrode and said drain electrode.

6. A method of reducing spurious signals in a high-frequency switching circuit, said high-frequency circuit comprising:

a semiconductor substrate;

at least one semiconductor switching device provided on the semiconductor substrate and including a gate terminal;

a gate electrode pad arranged on the semiconductor substrate to receive a control voltage to be applied to the gate terminal of the at least one semiconductor switching device; and a gate wiring pattern provided on the semiconductor substrate and arranged to connect the gate electrode pad and the gate terminal; wherein a portion of the gate wiring pattern is arranged to receive spurious signals from and to be adjacent to a source electrode and a drain electrode of the at least one semiconductor switching device;

said method comprising the steps of:

disposing a first resistor connected in series with another portion of the gate wiring pattern adjacent to the gate terminal of the at least one semiconductor switching device with no other circuit elements disposed on the gate wiring pattern between the first resistor and the gate terminal;

disposing a second resistor connected in series with a further portion of the gate wiring pattern, said second resistor including a first end being disposed closer to the gate electrode pad than a second end of the second resistor, the first end of the second resistor being connected with a first end of the gate electrode pad by the further portion of the gate wiring pattern with no other circuit elements disposed on the gate wiring pattern between the second resistor and the gate electrode pad; and arranging said first resistor and said second resistor in respective portions of said gate wiring pattern, said respective portions being disposed on opposite sides of said source electrode and said drain electrode of the at least one semiconductor switching device, said first and second resistors thereby attenuating said spurious signals in said gate wiring pattern; wherein a distance between the first end of the second resistor and the first end of the gate electrode pad is about 200 μm or less.

7. The method of claim 6, further comprising the step of interconnecting said first and second resistors via a portion of said gate wiring pattern which runs adjacent to said source electrode and said drain electrode.

8. A method of reducing spurious signals in a high-frequency switching circuit, said high frequency switching circuit comprising:

a semiconductor substrate;

a plurality of field effect transistors provided on the semiconductor substrate and each including a gate terminal;

a gate electrode pad arranged on the semiconductor substrate, to receive a control voltage to be applied to the gate terminal of at least one of the plurality of field effect transistors; and a gate wiring pattern provided on the semiconductor substrate and arranged to connect the gate electrode pad to said gate terminals; wherein a portion of the gate wiring pattern is arranged to receive spurious signals from and to be adjacent to a source electrode and a drain electrode of one of the field effect transistors, said method comprising the steps of:

disposing a plurality of first resistors each connected in series with another portion of the gate wiring pattern adjacent to a respective one of the gate terminals of the plurality of field effect transistors with no other circuit elements disposed on the gate wiring pattern between a respective one of the first resistors and the respective one of the gate terminals;

disposing a second resistor connected in series with a further portion of the gate wiring pattern, said second resistor including a first end being disposed closer to the gate electrode pad than a second end of the second resistor, the first end of the second resistor being connected with a first end of the gate electrode pad by the further portion of the gate wiring pattern with no other circuit elements disposed on the gate wiring pattern between the second resistor and the gate electrode pad; and arranging the first resistors and the second resistor in respective portions of said gate wiring pattern, said respective portions being disposed on opposite sides of the source electrode and the drain electrode of said at least one of the plurality of field effect transistors, said first and second resistors thereby attenuating said spurious signals in said gate wiring pattern; wherein a distance between the first end of the second resistor and the first end of the gate electrode pad is about 200 μm or less.

9. The method of claim 8, further comprising the step of interconnecting said first and second resistors via a portion of said gate wiring pattern which runs adjacent to said source electrode and said drain electrode.

10. The high-frequency switching circuit of claim 1, wherein said first portion of the gate wiring pattern having the first resistor, and said second portion of the gate wiring pattern having the second resistor, are connected in said gate wiring pattern on opposite sides of said third portion of the gate wiring pattern, which receives spurious signals from said source electrode and said drain electrode.

11. The high-frequency switching circuit of claim 2, wherein said first portion of the gate wiring pattern having the first resistor, and said second portion of the gate wiring pattern having the second resistor, are connected in said gate wiring pattern on opposite sides of said third portion of the gate wiring pattern, which receives spurious signals from said source electrode and sand drain electrode.

12. The method of claim 6, wherein said first portion of the gate wiring pattern having the first resistor, and said second portion of the gate wiring pattern having the second resistor, are connected in said gate wiring pattern on opposite sides of said third portion of the gate wiring pattern, which receives spurious signals from said source electrode and said drain electrode.

13. The method of claim 8, wherein said first portion of the gate wiring pattern having the first resistor, and said second portion of the gate wiring pattern having the second resistor, are connected in said gate wiring pattern on opposite sides of said third portion of the gate wiring pattern, which receives spurious signals from said source electrode and said drain electrode.

14. A high-frequency switching circuit comprising:
a semiconductor substrate;
a semiconductor switching device on the semiconductor substrate and including a gate, a source and a drain;
a source electrode pad and a drain electrode pad providing external connections for said source and said drain, respectively;
a gate electrode pad arranged on the semiconductor substrate to receive a control voltage to be applied to the gate;
a gate wiring pattern provided on the semiconductor substrate and arranged to connect the gate electrode pad to the gate; wherein
said gate wiring pattern includes:
a first resistor connected with a first portion of the gate wiring pattern adjacent to the gate with no other circuit elements disposed on the gate wiring pattern between the first resistor and the gate;
a second resistor connected with a second portion of the gate wiring pattern, said second resistor including a first end being disposed closer to the gate electrode pad than a second end of the second resistor, the first end of the second resistor being connected with a first end of the gate electrode pad by the second portion of the gate wiring pattern with no other circuit elements disposed on the gate wiring pattern between the second resistor and the gate electrode pad; and
a third portion of the gate wiring pattern arranged to interconnect said first and second portions; wherein
said first, second and third portions of said gate wiring pattern are arranged to define a surrounded area;
said source electrode pad and said drain electrode pad are disposed within the surrounded area and are surrounded by the gate wiring pattern on at least three sides thereof; and
a distance between the first end of the second resistor and the first end of the gate electrode pad is about 200 µm or less.

15. The high-frequency switching circuit of claim 14, wherein said gate wiring pattern defines a quadrilateral shape, said first and second portions of said gate wiring pattern being comprised in two opposite sides of said quadrilateral shape.

16. The high-frequency switching circuit of claim 15, wherein said source and drain electrode pads are disposed between said opposite sides.

17. The high-frequency switching circuit of claim 15, wherein said first and second portions of said gate wiring pattern are substantially parallel to each other.

18. The high-frequency switching circuit of claim 15, wherein said first and second portions of said gate wiring pattern define substantially parallel lines, respectively, and said source and drain electrode pads are disposed between said parallel lines.

* * * * *